United States Patent
Okumura

(10) Patent No.: US 11,489,071 B2
(45) Date of Patent: Nov. 1, 2022

(54) SEMICONDUCTOR DEVICE

(71) Applicant: FUJI ELECTRIC CO., LTD., Kawasaki (JP)

(72) Inventor: Keiji Okumura, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 10 days.

(21) Appl. No.: 17/234,218

(22) Filed: Apr. 19, 2021

(65) Prior Publication Data

US 2021/0408278 A1 Dec. 30, 2021

(30) Foreign Application Priority Data

Jun. 26, 2020 (JP) .............................. JP2020-110963

(51) Int. Cl.
*H01L 29/78* (2006.01)
*H01L 29/49* (2006.01)
*H01L 29/16* (2006.01)

(52) U.S. Cl.
CPC ...... *H01L 29/7813* (2013.01); *H01L 29/1608* (2013.01); *H01L 29/4941* (2013.01)

(58) Field of Classification Search
CPC ........... H01L 29/7813; H01L 29/66734; H01L 29/4236; H01L 29/0623; H01L 29/1095; H01L 29/1608; H01L 29/4238; H01L 29/45; H01L 29/4941; H01L 29/66068
See application file for complete search history.

(56) References Cited

U.S. PATENT DOCUMENTS

2006/0065925 A1* 3/2006 Yoshida .............. H01L 29/7811
257/329
2020/0388704 A1 12/2020 Tominaga

FOREIGN PATENT DOCUMENTS

| JP | 2019-195081 A | 11/2019 |
|----|---------------|---------|
| JP | 2019-216223 A | 12/2019 |
| WO | 2019/159351 A1 | 8/2019 |

OTHER PUBLICATIONS

Fukui et al., "Effects of Grounding Bottom Oxide Protection Layer in Trench-Gate SiC-MOSFET by Tilted Al Implantation", ICSCRM2019.

(Continued)

*Primary Examiner* — Eric A. Ward
(74) *Attorney, Agent, or Firm* — Rabin & Berdo, P.C.

(57) ABSTRACT

A semiconductor device includes a semiconductor substrate of a first conductivity type, having an active portion and a gate pad portion; a first semiconductor layer of the first conductivity type; and a second semiconductor layer of a second conductivity type. The active portion has first semiconductor regions of the first conductivity type, first trenches, gate insulating films, first gate electrodes, an interlayer insulating film, and second semiconductor regions of the second conductivity type. The gate pad portion has at least one second trench, an insulating film 9*b*, at least one second gate electrode, at least one fourth semiconductor region of the second conductivity type, and a gate electrode pad. Between the gate electrode pad and the semiconductor substrate, a polycrystalline silicon film is provided.

12 Claims, 11 Drawing Sheets

(56) References Cited

OTHER PUBLICATIONS

Mitsubishi Electric Corporation, "Mitsubishi Electric Develops Trench-type SiC-MOSFET with Unique Electric-field-limiting Structure", No. 3307, Tokyo, Sep. 30, 2019.
Tanaka et al., "Performance Improvement of Trench Gate SiC MOSFETs by Localized High-Concentration N-Type Ion Implantation", ICSCRM2019.

* cited by examiner ns and claims the benefit of
SEMICONDUCTOR DEVICE

CROSS REFERENCE TO RELATED APPLICATIONS

This application is based upon and claims the benefit of priority of the prior Japanese Patent Application No. 2020-110963, filed on Jun. 26, 2020, the entire contents of which are incorporated herein by reference.

BACKGROUND OF THE INVENTION

1. Field of the Invention

Embodiments of the invention relate to a semiconductor device.

2. Description of the Related Art

Silicon carbide (SiC) is expected to replace silicon (Si) as a next generation semiconductor material. Compared to a conventional semiconductor device in which silicon is used as a semiconductor material, a semiconductor device in which silicon carbide is used as a semiconductor material (hereinafter, silicon carbide semiconductor device) has various advantages as such as enabling use under higher temperature environments (at least 200 degrees C.) and reducing device resistance in an ON state to one of a few hundredths of that of the conventional semiconductor device. These advantages are due to characteristics of the material itself such as the bandgap of silicon carbide being about three times that of silicon and dielectric breakdown electric field strength being nearly ten times greater than that of silicon.

As silicon carbide semiconductor devices, Schottky barrier diodes (SBDs) and vertical metal oxide semiconductor field effect transistors (MOSFETs) having a planar gate structure or a trench gate structure have been made into products.

A planar gate structure is a MOS gate structure in which a MOS gate is provided in a flat plate-like shape on the front surface of a semiconductor substrate. A trench gate structure is a MOS gate structure in which a MOS gate is embedded in a trench formed in a semiconductor substrate (semiconductor chip) at a front surface of the semiconductor substrate and in which a channel (inversion layer) is formed along sidewalls of the trench, in a direction orthogonal to the front surface of the semiconductor substrate. Therefore, compared to a planar gate structure in which a channel is formed along the front surface of the semiconductor substrate, unit cell (constituent unit of a device element) density per unit area may be increased and current density per unit area may be increased, which is advantageous in terms of cost.

A structure of a conventional silicon carbide semiconductor device is described taking a trench-type MOSFET as an example. FIG. 15 is a cross-sectional view of the structure of an active region of the conventional silicon carbide semiconductor device. FIG. 15 depicts the structure of an active region 140 through which current passes during an ON state. As depicted in FIG. 15, in a trench-type MOSFET 170, on a front surface of an $n^+$-type silicon carbide substrate 101, an $n^-$-type silicon carbide epitaxial layer 102 is deposited. On a first side of the $n^-$-type silicon carbide epitaxial layer 102 opposite to a second side thereof facing the $n^+$-type silicon carbide substrate 101, n-type high-concentration regions 105 are provided. In the $n^-$-type silicon carbide epitaxial layer 102, first $p^+$-type base regions 103 are selectively provided so as to each underlie an entire area of a bottom of a respective trench 116.

Further, as a MOS structure portion, a p-type silicon carbide epitaxial layer 106, $n^+$-type source regions 107, $p^+$-type contact regions 108, gate insulating films 109, gate electrodes 110, an interlayer insulating film 111, a source electrode 112, a back electrode 113, the trenches 116, a source electrode pad (not depicted), and a drain electrode pad (not depicted) are provided. The source electrode 112 is provided on the $n^+$-type source regions 107, the p-type silicon carbide epitaxial layer 106, and the source electrode pad is provided on the source electrode 112.

At the bottoms of the trenches 116, the first $p^+$-type base regions 103 are provided, whereby concentration of electric field at the bottoms of the trenches 116 is prevented, thereby protecting the gate insulating films 109. On the other hand, to sustain a withstand voltage, the first $p^+$-type base regions 103 are not floating and have to be provided with and set to have a potential equal to that of the source electrode 112. Thus, a structure in which second $p^+$-type base regions 104 are selectively provided at a portion of a sidewall of a channel of the trenches 116 is known. By this structure, punch-through is prevented and the withstand voltage may be sustained. The second $p^+$-type base regions 104 are provided at m-plane sidewalls of the trenches 116, whereby an a-plane having high mobility may be used in the channel. Further, by providing the second $p^+$-type base regions 104, provision of a p-type region between the trenches 116 becomes unnecessary, thereby enabling cell pitch to be shortened.

Further, a semiconductor device is known in which electric field mitigating regions are provided so as to be in contact with bottoms of gate trenches, whereby electric field applied to the bottoms of the gate trenches when the semiconductor device is OFF may be mitigated (refer to Japanese Laid-Open Patent Publication No. 2019-195081). Further, a semiconductor device is known in which in a non-device-element region, second trenches having bottoms that reach a drift layer are provided and low-resistance regions are provided via inner insulating films in the second trenches, whereby capacitance is formed and during high-speed switching, displacement current passing through second mitigating regions below the second trenches is split by the low-resistance regions, and the magnitude of drops in potential due to the displacement current may be suppressed (refer to International Publication No. WO 2019/159351).

SUMMARY OF THE INVENTION

According to an embodiment of the invention, a semiconductor device includes a semiconductor substrate of a first conductivity type, having an active portion and a gate pad portion, the semiconductor substrate having a first surface and a second surface opposite to each other; a first semiconductor layer of the first conductivity type, provided on the first surface of the semiconductor substrate, and having an impurity concentration lower than an impurity concentration of the semiconductor substrate, the first semiconductor layer having a first surface and a second surface opposite to each other, the second surface of the first semiconductor layer facing the semiconductor substrate; a second semiconductor layer of a second conductivity type, provided on the first surface of the first semiconductor layer, the second semiconductor layer having a first surface and a second surface opposite to each other, the second surface of the second semiconductor layer facing the semiconductor substrate; in the active portion: a plurality of first semiconductor regions of the first conductivity type, selectively provided in the second semiconductor layer at the first surface thereof; a plurality of first trenches penetrating through the first semiconductor regions and the second semiconductor layer and reaching the first semiconductor layer; a plurality of first gate electrodes provided in the first trenches via gate insulating films, respectively; an interlayer insulating film provided on the first gate electrodes; a first electrode provided on a surface of the second semiconductor layer and a surface of each of the first semiconductor regions; a second electrode provided on the second surface of the semiconductor substrate; and a plurality of second semiconductor regions of the second conductivity type, each provided in the first semiconductor layer so as to be in contact with a respective one of bottoms of the first trenches; in the gate pad portion: one or more second trenches each penetrating the second semiconductor layer and reaching the first semiconductor layer; an insulating film provided in all of the one or more second trenches; one or more second gate electrodes provided on the insulating film in the one or more second trenches, respectively; one or more fourth semiconductor regions of the second conductivity type, each provided in the first semiconductor layer so as to be in contact with a respective one of bottoms of the one or more second trenches; a gate electrode pad connected electrically to the one or more second gate electrodes; and a polycrystalline silicon film provided between the gate electrode pad and the semiconductor substrate.

Objects, features, and advantages of the present invention are specifically set forth in or will become apparent from the following detailed description of the invention when read in conjunction with the accompanying drawings.

DETAILED DESCRIPTION OF THE INVENTION

Figure 16:
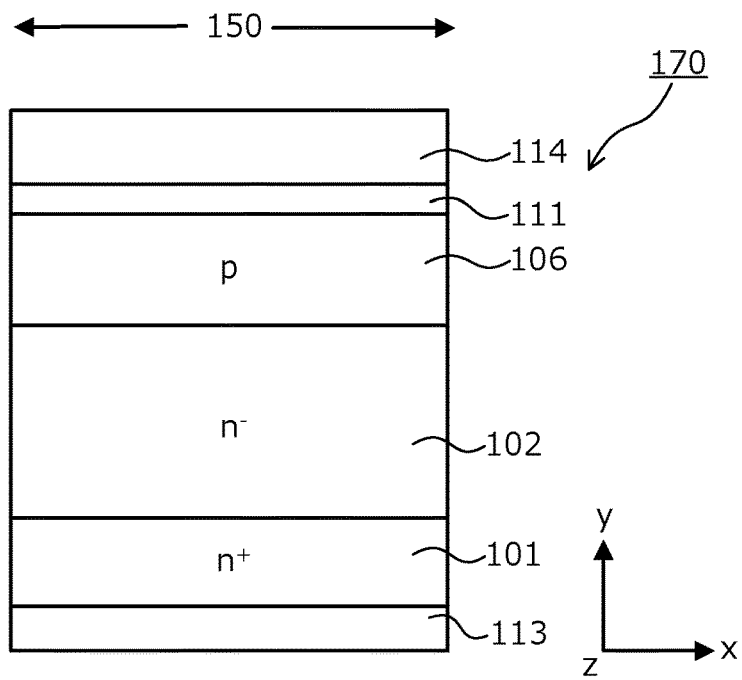
FIG. 16 is a cross-sectional view of a first structure of a gate pad region of a conventional silicon carbide semiconductor device.
Figure 17:
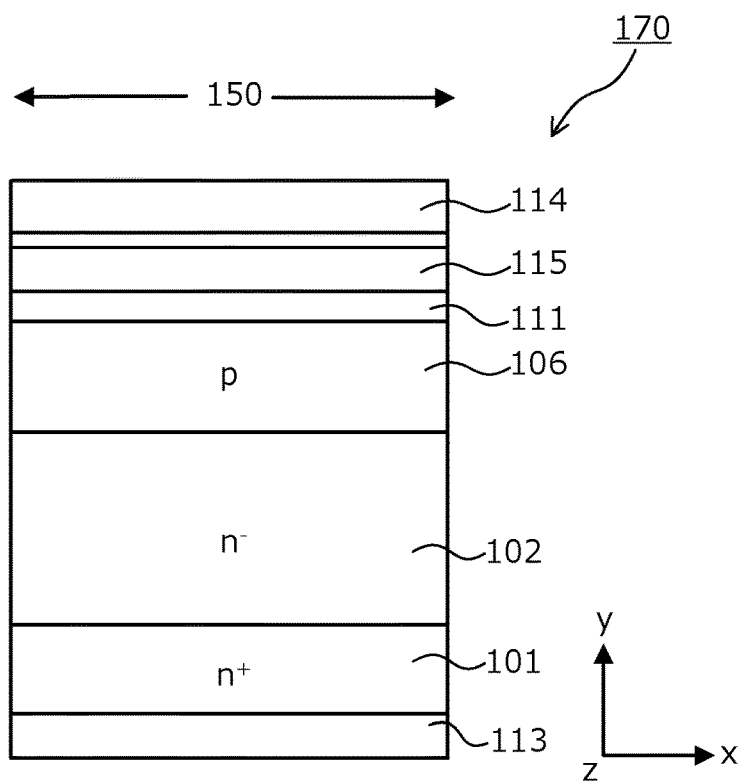
FIG. 17 is a cross-sectional view of a second structure of the gate pad region of a conventional silicon carbide semiconductor device.

First, problems associated with the conventional techniques are discussed. FIG. 16 is a cross-sectional view of a first structure of a gate pad region of a conventional silicon carbide semiconductor device. Further, FIG. 17 is a cross-sectional view of a second structure of the gate pad region of a conventional silicon carbide semiconductor device. In a gate pad region 150, similarly to the active region 140, on the front surface of the $n^+$-type silicon carbide substrate 101, the $n^-$-type silicon carbide epitaxial layer 102 and the p-type silicon carbide epitaxial layer 106 are provided. On the p-type silicon carbide epitaxial layer 106, a gate electrode pad 114 is provided via the interlayer insulating film 111. As depicted in FIG. 17, gate electrode wiring 115 may be provided in the interlayer insulating film 111. On a back surface of the $n^+$-type silicon carbide substrate 101, the back electrode 113 is provided.

As depicted in FIGS. 16 and 17, in the conventional trench structures, no trench structure is provided in the gate pad region 150. Therefore, the first $p^+$-type base regions 103 and the second $p^+$-type base regions 104 cannot be provided. As a result, in the gate pad region 150, a pn interface between the p-type silicon carbide epitaxial layer 106 and the $n^-$-type silicon carbide epitaxial layer 102 is positioned shallower from the surface of the p-type silicon carbide epitaxial layer 106 than in the active region 140, and electric field concentrates at the pn interface in the gate pad region 150. Therefore, avalanche breakdown occurs in the gate pad region 150 and the withstand voltage cannot be sustained, whereby a problem arises in that reliability of the gate pad region 150 degrades.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index. Further, with consideration of variation in manufacturing, description indicating the same or equal is assumed to include being within 5%.

Figure 1A:
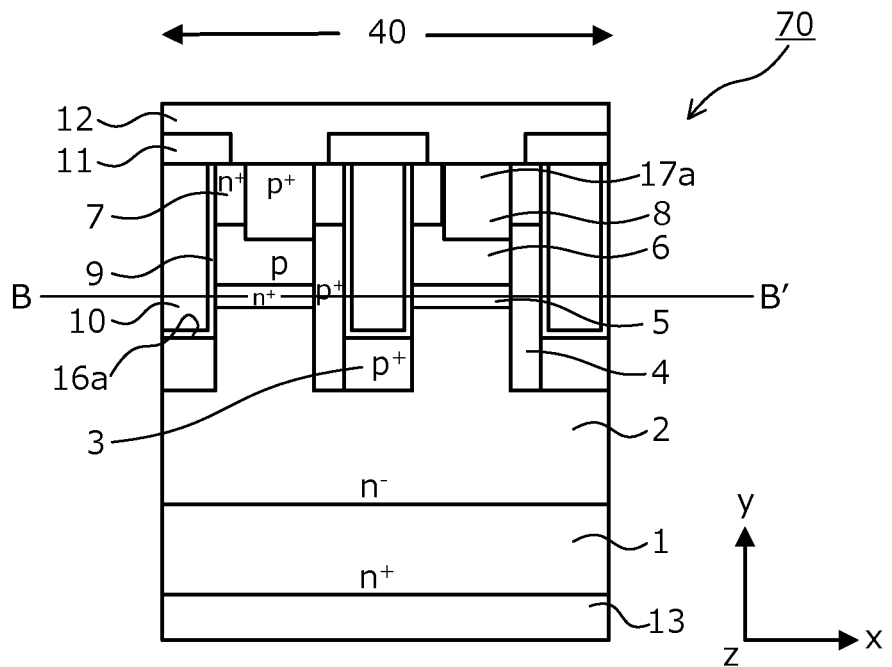
FIG. 1A is a cross-sectional view of a structure of an active region of a silicon carbide semiconductor device taken along line A-A' in FIG. 1B according to a first embodiment.
Figure 1B:
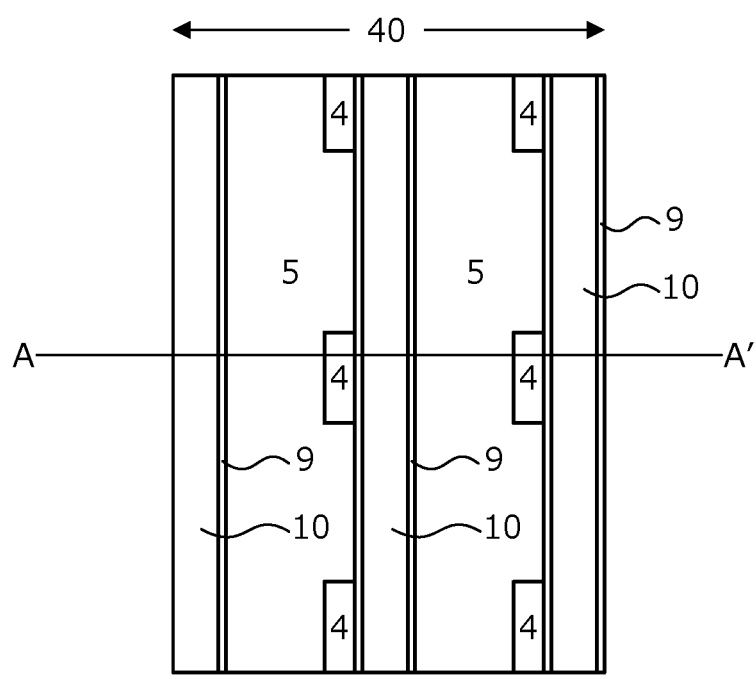
FIG. 1B is a plan view of a structure of the active region of the silicon carbide semiconductor device taken along line B-B' in FIG. 1A according to the first embodiment.

A semiconductor device according to the invention is configured using a wide bandgap semiconductor. In a first embodiment, a silicon carbide semiconductor device fabricated (manufactured) using, for example, silicon carbide (SiC) as a wide bandgap semiconductor is described taking a trench-type MOSFET 70 as an example. FIG. 1A is a cross-sectional view of a structure of an active region of a silicon carbide semiconductor device taken along line A-A' in FIG. 1B according to the first embodiment. FIG. 1B is a plan view of a structure of the active region of the silicon carbide semiconductor device taken along line B-B' in FIG. 1A according to the first embodiment.

In the silicon carbide semiconductor device according to the first embodiment, in an outer peripheral portion of an active region 40 through which main current flows, an edge termination region surrounding a periphery of the active region 40 and a gate pad region 50 connected to gate electrodes are provided. In FIGS. 1A and 1B, only the active region 40 of the trench-type MOSFET 70 is depicted.

As depicted in FIG. 1A, the trench-type MOSFET 70, on a front side (side having a later-described p-type silicon carbide epitaxial layer 6) of a semiconductor substrate, has MOS gates having a trench gate structure. In a silicon carbide semiconductor base, on an $n^+$-type silicon carbide substrate (semiconductor substrate of a first conductivity type) 1 containing silicon carbide, an $n^-$-type silicon carbide epitaxial layer (first semiconductor layer of the first conductivity type) 2 is epitaxially grown sequentially. Further, an n-type high-concentration region 5 may be epitaxially grown on the $n^-$-type silicon carbide epitaxial layer 2.

The MOS gates having a trench gate structure are configured by a p-type silicon carbide epitaxial layer (second semiconductor layer of a second conductivity type) 6, $n^+$-type source regions (first semiconductor regions of the first conductivity type) 7, $p^+$-type contact regions 8, trenches (first trenches) 16a, gate insulating films 9, and gate electrodes (first gate electrodes) 10. The $p^+$-type contact regions 8 may be omitted.

In particular, the trenches 16a penetrate through the p-type silicon carbide epitaxial layer 6 from the front surface of the semiconductor substrate in a depth direction y and reach the n-type high-concentration region 5 (in an instance in which the n-type high-concentration region 5 is not provided, the $n^-$-type silicon carbide epitaxial layer 2, hereinafter indicated as "(2)"). The depth direction y is a direction from the front surface toward a back surface of the semiconductor substrate. The trenches 16a are disposed in a striped pattern (refer to FIG. 7).

In the trenches 16a, the gate insulating films 9 are provided along inner walls of the trenches 16a and the gate electrodes 10 are provided on the gate insulating films 9, so as to be embedded in the trenches 16a. One unit cell of a main semiconductor device element is configured by one of the gate electrodes 10 in one of the trenches 16a and adjacent mesa regions 17a sandwiching said gate electrode 10 (a mesa region being a region between adjacent trenches 16a of the trenches 16a). In FIG. 1A, while three trench MOS structures are depicted, further MOS gate (insulated gate having a metal, oxide film, and semiconductor) structures having the trench structure may be disposed.

At a surface layer of the $n^-$-type silicon carbide epitaxial layer 2 on a source side thereof (side facing a later-described source electrode 12), an n-type region (hereinafter, n-type high-concentration region) 5 may be provided so as to be in contact with the p-type silicon carbide epitaxial layer 6. The n-type high-concentration region 5 is a so-called current spreading layer (CSL) that reduces carrier spreading resistance. The n-type high-concentration region 5, for example, is provided uniformly in a direction parallel to a substrate front surface (the front surface of the semiconductor substrate) so as to be exposed at the inner walls of the trenches 16a. The n-type high-concentration region 5 is provided from an interface with the p-type silicon carbide epitaxial layer 6 to a position not reaching the bottoms of the trenches 16a. The n-type high-concentration region 5 may be provided deeper than the bottoms of the trenches 16a and may be provided to a position shallower than bottoms of later-described first $p^+$-type base regions 3.

In the $n^-$-type silicon carbide epitaxial layer 2, the first $p^+$-type base regions (second semiconductor regions of the second conductivity type) 3 may be selectively provided. Of the bottoms and bottom corner portions of the trenches 16a, the first $p^+$-type base regions 3 underlie at least the bottoms. The bottom corner portions of the trenches 16a are borders between the bottom and sidewalls of the trenches 16a.

Pn junctions between the first $p^+$-type base regions 3 and the $n^-$-type silicon carbide epitaxial layer 2 are formed at positions deeper on a drain side than are the bottoms of the trenches 16a. A depth position of drain-side ends of the first $p^+$-type base regions 3 suffice to be positions so that the pn junctions between the first $p^+$-type base regions 3 and the $n^-$-type silicon carbide epitaxial layer 2 are deeper on the drain side than are the bottoms of the trenches 16a and are variously changed according to design conditions. By the first $p^+$-type base regions 3, application of high electric field to the gate insulating films 9 at portions along the bottoms of the trenches 16a may be prevented.

Second $p^+$-type base regions (third semiconductor regions of the second conductivity type) 4 may be provided in the $n^-$-type silicon carbide epitaxial layer 2 (in an instance in which the n-type high-concentration region 5 is provided, in the $n^-$-type silicon carbide epitaxial layer 2 and the n-type high-concentration region 5, hereinafter indicated as "(2, 5)") so that at least one sidewall of each of the trenches 16a is in contact with at least one of the second $p^+$-type base regions 4 in a second direction (x-direction) orthogonal to a first direction (z-direction) parallel to an extending direction in which the trenches 16a extend. The sidewall in contact may be an m-plane or may be an a-plane.

The second $p^+$-type base regions (third semiconductor regions of the second conductivity type) 4 are provided so as to be in contact with the p-type silicon carbide epitaxial layer 6 and the first $p^+$-type base regions 3. As depicted in FIG. 1A, each of the second $p^+$-type base regions 4 may have a bottom at a same depth as that of the first $p^+$-type base regions 3, may be in contact with the $n^-$-type silicon carbide epitaxial layer 2, and may have a top surface in contact with the later-described $n^+$-type source regions 7. By the second $p^+$-type base regions 4, the first $p^+$-type base regions 3 and the p-type silicon carbide epitaxial layer 6 are connected to each other electrically, the first $p^+$-type base regions 3 are not floating and have a potential equal to that of the source electrode 12. As a result, punch-through is prevented and the withstand voltage may be sustained.

In the $n^-$-type silicon carbide epitaxial layer 2 (2, 5), the second $p^+$-type base regions 4 may be provided in plural along the first direction parallel to the extending direction of the trenches 16a, the second p+-type base regions 4 being apart from one another along the first direction by an interval. In this instance, along each the trenches 16a, one of the sidewalls thereof in the first direction alternately contacts the n−-type silicon carbide epitaxial layer 2 (2, 5) and the second p+-type base regions 4.

One of the second p+-type base regions 4 may be provided for each of the trenches 16a at the sidewall thereof, without the intervals. In this instance, along each of the trenches 16a, one of the sidewalls thereof is in contact with one of the second p+-type base regions 4 in the first direction.

In the p-type silicon carbide epitaxial layer 6, the n+-type source regions 7 and the p+-type contact regions 8 are selectively provided. The n+-type source regions 7 are in contact with the gate insulating films 9 at the sidewalls of the trenches 16a and face the gate electrodes 10 across the gate insulating films 9 at the sidewalls of the trenches 16a.

An interlayer insulating film 11 is provided in an entire area of the front surface of the semiconductor substrate so as to cover the gate electrodes 10. In the interlayer insulating film 11, contact holes penetrating through the interlayer insulating film 11 in the depth direction y and reaching the substrate front surface are opened.

The source electrode (first electrode) 12 is in ohmic contact with the semiconductor substrate (the n+-type source regions 7) in the contact holes opened in the interlayer insulating film 11 and is electrically insulated from the gate electrodes 10 by the interlayer insulating film 11. On the source electrode 12, the source electrode pad (not depicted) is provided. The source electrode 12 is in ohmic contact with the n+-type source regions 7 and the p+-type contact regions 8. In an instance in which the p+-type contact regions 8 are not provided, the source electrode 12 is in ohmic contact with the n+-type source regions 7 and the p-type silicon carbide epitaxial layer 6.

On the back surface of the semiconductor substrate, a back electrode (second electrode) 13 constituting a drain electrode is provided. On the back electrode 13, a drain electrode pad (not depicted) is provided.

Figure 2:
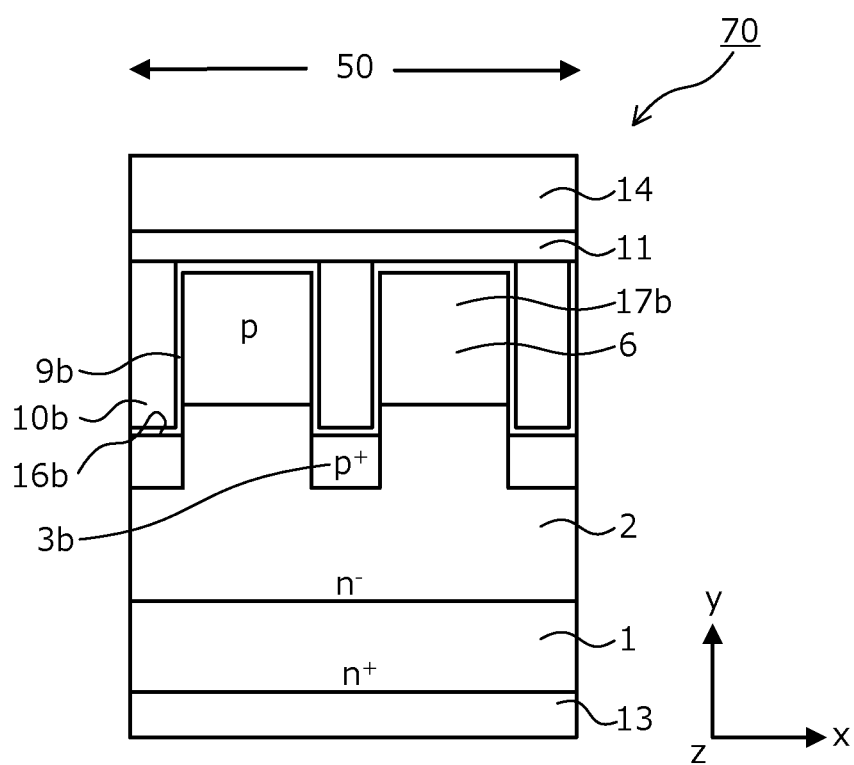
FIG. 2 is a cross-sectional view of a first structure of a gate pad region of the silicon carbide semiconductor device according to the first embodiment.

FIG. 2 is a cross-sectional view of a first structure of the gate pad region of the silicon carbide semiconductor device according to the first embodiment. In the gate pad region 50, similarly to the active region 40, on the front surface of the n+-type silicon carbide substrate 1, the n−-type silicon carbide epitaxial layer 2 and the p-type silicon carbide epitaxial layer 6 are provided. Respective thicknesses and impurity concentrations of the n+-type silicon carbide substrate 1, the n−-type silicon carbide epitaxial layer 2, and the p-type silicon carbide epitaxial layer 6 in the gate pad region 50 are equal to those of the n+-type silicon carbide substrate 1, the n−-type silicon carbide epitaxial layer 2, the p-type silicon carbide epitaxial layer 6 of the active region. Further, the p-type silicon carbide epitaxial layer 6 of the gate pad region 50 is continuous with the p-type silicon carbide epitaxial layer 6 of the active region 40.

In the first embodiment, in the gate pad region 50, trench gate structures configured by trenches (second trenches) 16b, a gate insulating film (insulating film) 9b, and gate electrodes (second gate electrodes) 10b is provided. In the gate pad region 50, a width and depth of the trenches 16b are equal to a width and a depth of the trenches 16a in the active region 40. Further, in the gate pad region 50, the gate insulating film 9b is further provided on the surface of the semiconductor substrate in a mesa region 17b between adjacent trenches 16b of the trenches 16b.

Further, in the n−-type silicon carbide epitaxial layer 2, first p+-type base regions (fourth semiconductor regions of the second conductivity type) 3b may be selectively provided. Similarly to the active region 40, of the bottoms and bottom corner portions of the trenches 16b, the first p+-type base regions 3b underlie at least the bottoms. A width and a depth of the first p+-type base regions 3b in the gate pad region 50 are equal to a width and a depth of the first p+-type base regions 3 in the active region 40.

The interlayer insulating film 11 is provided in an entire area of the front surface of the semiconductor substrate via the gate insulating film 9b, a gate electrode pad 14 connected electrically to the gate electrodes 10 is provided on the interlayer insulating film 11. The back electrode 13 constituting the drain electrode is provided on the back surface of the semiconductor substrate. On the back electrode 13, the drain electrode pad (not depicted) is provided. Further, at the surface layer of the n−-type silicon carbide epitaxial layer 2 on the source side thereof, the n-type high-concentration region 5 may be provided so as to be in contact with the p-type silicon carbide epitaxial layer 6.

In this manner, in the first embodiment, in the gate pad region 50, the trenches 16b are provided, and the first p+-type base regions 3b underlying the bottoms of the trenches 16b are provided. As a result, pn interfaces between the n−-type silicon carbide epitaxial layer 2 and the first p+-type base regions 3, 3b are at the same depth from the surface of the silicon carbide semiconductor base in the active region 40 and in the gate pad region 50. Therefore, concentration of avalanche current at the gate pad region 50 is eliminated, it becomes possible to sustain withstand voltage of the gate pad region 50, and reliability of the gate insulating films 9 may be enhanced.

Here, the trenches 16b of the gate pad region 50 may or may not be continuous with the trenches 16a of the active region 40. In an instance in which the trenches 16b are continuous with the trenches 16a, by connecting the first p+-type base regions 3b with the first p+-type base regions 3 of the active region 40, the first p+-type base regions 3b may be easily set to have a potential equal to that of the source electrode 12. In an instance in which the trenches 16b are not continuous with the trenches 16a, the width (second width) and the depth of the trenches 16b may be greater than the width (first width) and the depth of the trenches 16a. Further, the impurity concentration of the first p+-type base regions 3b may be set higher than that of the first p+-type base regions 3 of the active region 40. As a result, concentration of holes in the trenches 16b is facilitated, thereby facilitating control of the holes.

Figure 3:
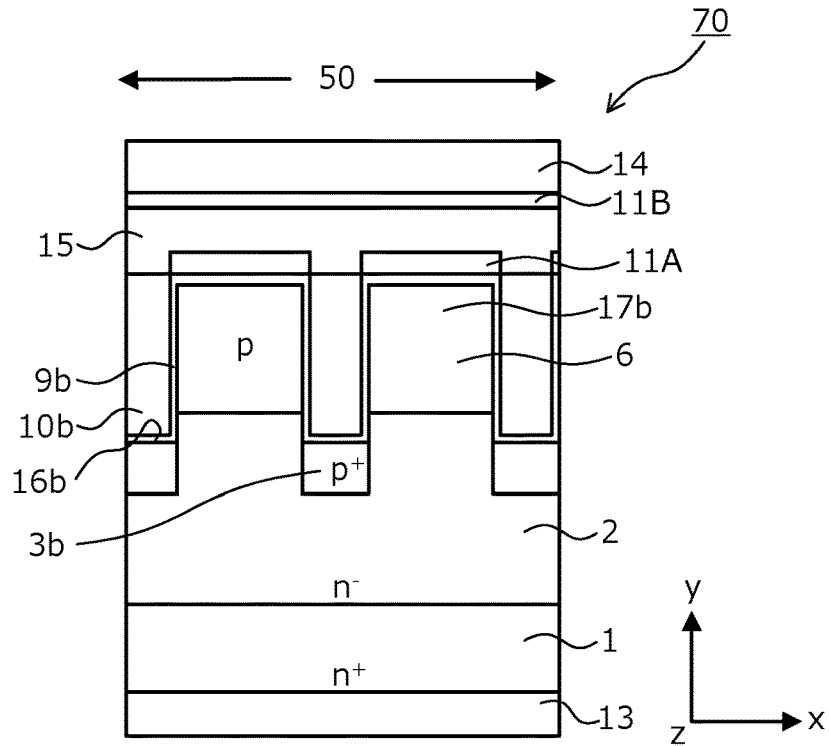
FIG. 3 is a cross-sectional view of a second structure of the gate pad region of the silicon carbide semiconductor device according to the first embodiment.

FIG. 3 is a cross-sectional view of a second structure of the gate pad region of the silicon carbide semiconductor device according to the first embodiment. As depicted in FIG. 3, in the gate pad region 50, an interlayer insulating film 11A is provided in an entire area of a front surface of the semiconductor base via the gate insulating film 9b so as to cover the p-type silicon carbide epitaxial layer 6. In the interlayer insulating film 11A, contact holes penetrating through the interlayer insulating film 11A in the depth direction y and reaching the substrate front surface are opened. In the gate pad region 50, a gate electrode wiring (polycrystalline silicon film) 15 containing a polycrystalline silicon (poly-Si is provided in an entire area of the front surface of the semiconductor base. Other than a polycrystalline silicon, the gate electrode wiring 15 may use a high-melting point metal such as titanium or tungsten, a silicide thereof, a nitride, and a stacked film of these. In the contact holes provided in the interlayer insulating film 11A, the gate electrode wiring 15 is in ohmic contact with the gate electrodes 10 and is electrically insulated from the p-type silicon carbide epitaxial layer 6 by the interlayer insulating film 11A.

On the gate electrode wiring 15, the gate electrode pad 14 is provided via an interlayer insulating film 11B. In other words, the polycrystalline silicon film is provided as the gate electrode wiring 15 in an entire area between the gate electrode pad 14 and the $n^+$-type silicon carbide substrate 1. The gate electrode wiring 15 and the gate electrode pad 14 are connected electrically. In FIG. 3, the interlayer insulating film 11B of the gate pad region 50 is free of a contact hole and in portions other than the gate pad region 50, the gate electrode wiring 15 and the gate electrode pad 14 are connected. In this instance, there is an advantage in that a bonding area when a wire is bonded to the gate electrode pad 14 does not decrease. Furthermore, the interlayer insulating film 11B is assuredly directly beneath the gate electrode pad 14 and therefore, damage to a lower device element structure is minimal. Further, a contact hole may be provided in the interlayer insulating film 11B of the gate pad region 50 and through the contact hole, the gate electrode wiring 15 and the gate electrode pad 14 may be connected electrically. In this instance, the interlayer insulating film 11B between the gate electrode pad 14 and the gate electrode wiring 15 may be opened largely and contact resistance between the gate electrode pad 14 and the gate electrode wiring 15 may be reduced.

In this manner, in the gate pad region 50, the gate electrode wiring 15 is provided in an entire area beneath the gate electrode pad 14, whereby the surface of the gate electrode pad 14 may be made flat, and the bonding area when a wire is bonded to the gate electrode pad 14 may be increased. Furthermore, a cross-sectional area of the gate electrode wiring 15 beneath the gate electrode pad 14 increases and therefore, gate resistance (Rg) may be reduced.

Figure 4:
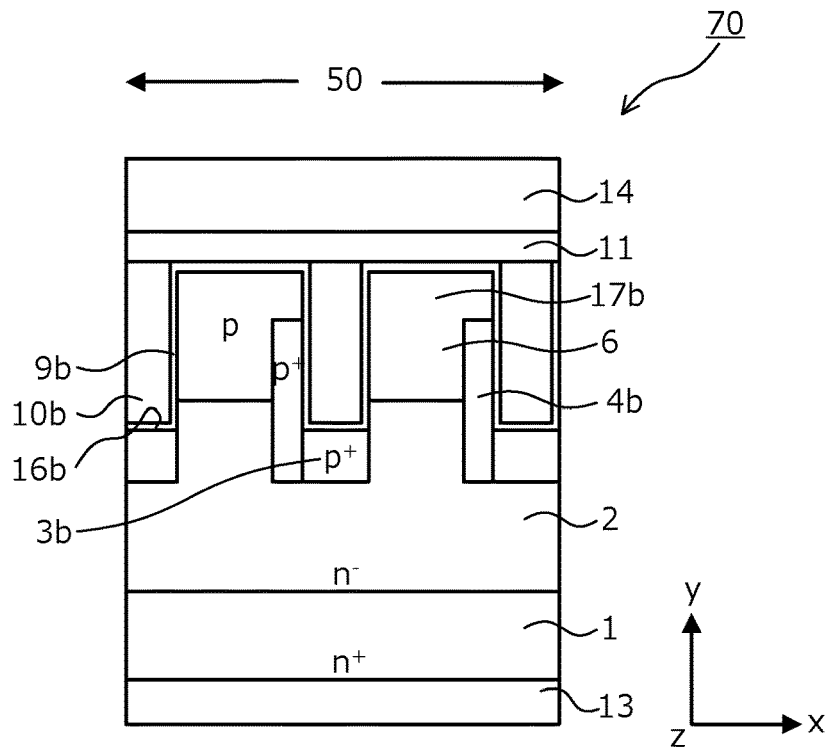
FIG. 4 is a cross-sectional view of a third structure of the gate pad region of the silicon carbide semiconductor device according to the first embodiment.

FIG. 4 is a cross-sectional view of a third structure of the gate pad region of the silicon carbide semiconductor device according to the first embodiment. As depicted in FIG. 4, in the gate pad region 50, at a portion of a sidewall of each of the trenches 16b, a second $p^+$-type base region (fifth semiconductor regions of the second conductivity type) 4b is selectively provided. The second $p^+$-type base regions 4b are provided so as to be in contact with the p-type silicon carbide epitaxial layer 6 and the first $p^+$-type base regions 3b. A width and a depth of the second $p^+$-type base regions 4b in the gate pad region 50 are equal to a width and a depth of the second $p^+$-type base regions 4 in the active region 40.

Figure 7:
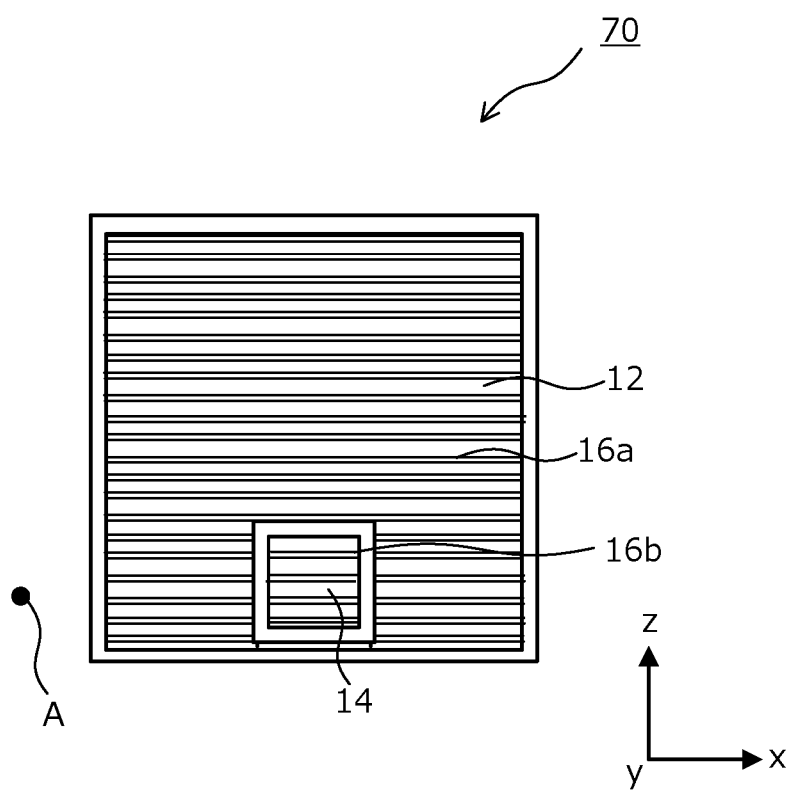
FIG. 7 is a top view of the structure of the silicon carbide semiconductor device according to the first embodiment.

The p-type silicon carbide epitaxial layer 6 of the gate pad region 50 is continuous until and connected to the p-type silicon carbide epitaxial layer 6 of the active region 40 in the first direction (z-direction) (refer to FIG. 7). Therefore, similarly to the active region 40, the first $p^+$-type base regions 3b and the p-type silicon carbide epitaxial layer 6 are connected electrically by the second $p^+$-type base regions 4b, the first $p^+$-type base regions 3b are not floating and have a potential equal to that of the source electrode 12. As a result, punch-through is prevented and the withstand voltage is sustained.

Similarly to the active region 40, in the $n^-$-type silicon carbide epitaxial layer 2, the second $p^+$-type base regions 4b may be provided in plural along the first direction parallel to the extending direction of the trenches 16b, the second $p^+$-type base regions 4b being apart from one another along the first direction by an interval. In this instance, along each of the trenches 16b, one of the sidewalls thereof in the first direction alternately contacts the $n^-$-type silicon carbide epitaxial layer 2 and each of the second $p^+$-type base regions 4b corresponding to said trench 16b. One of the second $p^+$-type base regions 4b may be provided for each of the trenches 16b at the sidewall thereof, without the intervals. In this instance, along each of the trenches 16b, one of the sidewalls thereof is in contact with one of the second $p^+$-type base regions 4b along the first direction.

Figure 5:
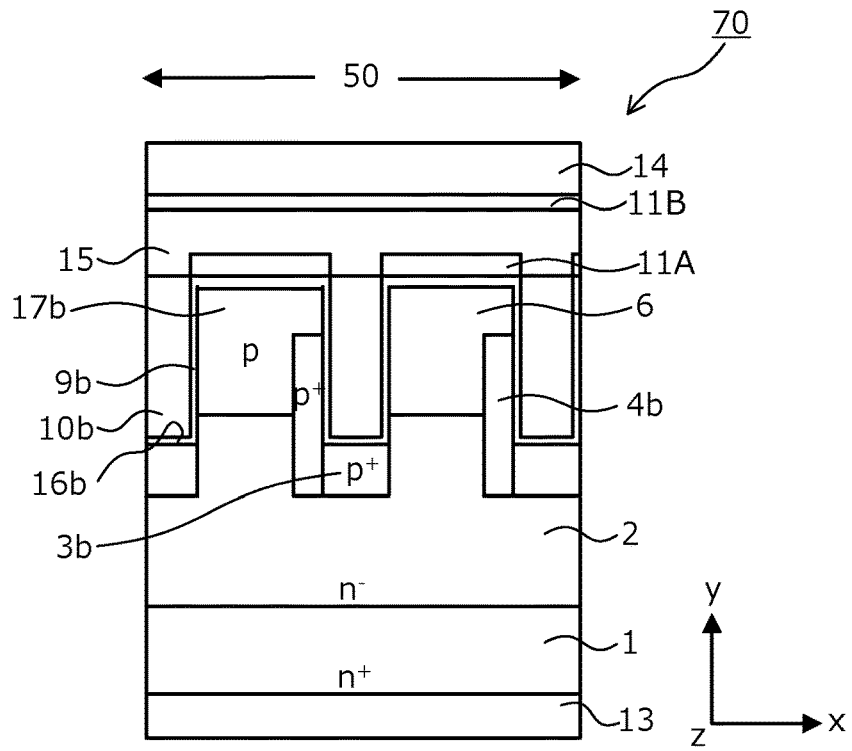
FIG. 5 is a cross-sectional view of a fourth structure of the gate pad region of the silicon carbide semiconductor device according to the first embodiment.

FIG. 5 is a cross-sectional view of a fourth structure of the gate pad region of the silicon carbide semiconductor device according to the first embodiment. As depicted in FIG. 5, in the gate pad region 50, the gate electrode wiring 15 is provided in an entire area of the front surface of the semiconductor base and the second $p^+$-type base regions 4b are provided at a portion of a sidewall of each of the trenches 16b. In this manner, the fourth structure has characteristics of the second structure and the third structure and has effects of both the second structure and the third structure.

Figure 6:
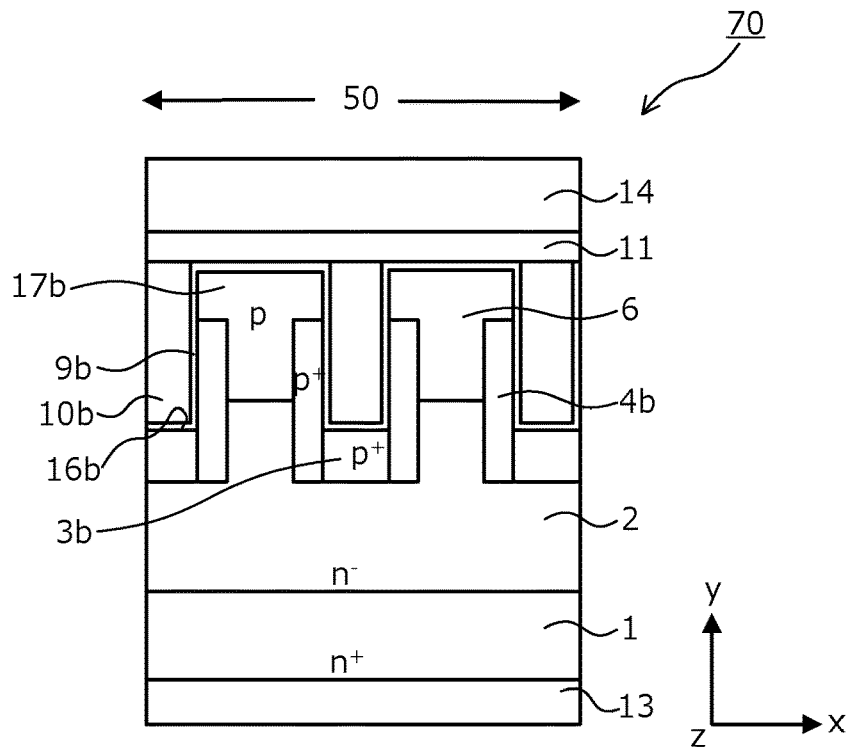
FIG. 6 is a cross-sectional view of a fifth structure of the gate pad region of the silicon carbide semiconductor device according to the first embodiment.

FIG. 6 is a cross-sectional view of a fifth structure of the gate pad region of the silicon carbide semiconductor device according to the first embodiment. As depicted in FIG. 6, the second $p^+$-type base regions 4b are selectively provided at both sidewalls of each of the trenches 16b. The trenches 16b of the gate pad region 50 do not function as MOS gates, the need to form a channel is eliminated, and the second $p^+$-type base regions 4b may be provided at both sidewalls. As a result, punch-through may be prevented and the withstand voltage may be sustained to a greater extent as compared to the third structure in FIG. 4. Further, while not depicted, with the structure in FIG. 6, in the gate pad region 50, the gate electrode wiring 15 may be provided in an entire area of the front surface of the semiconductor base.

FIG. 7 is a top view of the structure of the silicon carbide semiconductor device according to the first embodiment. In FIG. 7, a region beneath the source electrode 12 is the active region 40 and a region beneath the gate electrode pad 14 is the gate pad region 50. Further, the p-type silicon carbide epitaxial layer 6 of the gate pad region 50 is continuous with the p-type silicon carbide epitaxial layer 6 of the active region 40. As depicted in FIG. 7, the extending direction (x-direction) of the trenches 16b of the gate pad region 50 may be preferably set to be a same direction as the extending direction of the trenches 16a of the active region 40. Further, in the gate pad region 50, the extending direction of the trenches 16b may be preferably a direction parallel to a wire connected to the gate electrode pad 14. For example, an end of this wire is at position A that is outside the trench-type MOSFET 70 in the x-direction, and position A and the gate electrode pad 14 are connected by the wire. As a result, when the wire is connected to the gate electrode pad 14, an occurrence of shell cracks that, for example, destroy the interlayer insulating film 11 may be prevented.

Next, a method of manufacturing the silicon carbide semiconductor device according to the first embodiment is described. FIGS. 8, 9, 10, 11, and 12 are cross-sectional views of states of the silicon carbide semiconductor device according to the first embodiment during manufacture.

Figure 8:
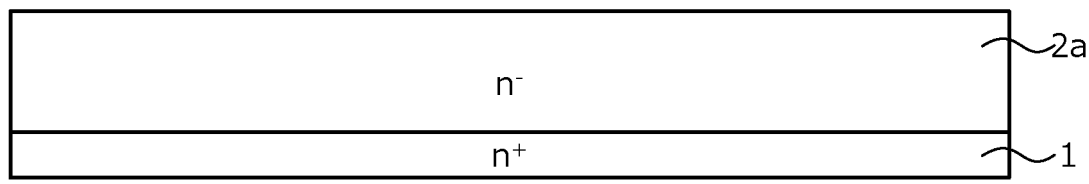
FIG. 8 is a cross-sectional view of a state of the silicon carbide semiconductor device according to the first embodiment during manufacture.

First, the $n^+$-type silicon carbide substrate 1 containing an n-type silicon carbide is prepared. Subsequently, on the front surface of the $n^+$-type silicon carbide substrate 1, a lower $n^-$-type silicon carbide epitaxial layer 2a containing silicon carbide is epitaxially grown while an n-type impurity, for example, nitrogen atoms, is doped. The state up to here is depicted in FIG. 8.

Next, on the surface of the lower $n^-$-type silicon carbide epitaxial layer 2a, an ion implantation mask having predetermined openings is formed by a photolithographic technique, for example, using an oxide film. Subsequently, a p-type impurity such as aluminum is implanted in the openings of the oxide film, thereby forming the first p$^+$-type base regions 3, 3b.

Next, on the surface of the lower n$^-$-type silicon carbide epitaxial layer 2a, an upper n$^-$-type silicon carbide epitaxial layer 2b containing silicon carbide is epitaxially grown while an n-type impurity such as nitrogen is doped. The lower n$^-$-type silicon carbide epitaxial layer 2a and the upper n$^-$-type silicon carbide epitaxial layer 2b combined form the n$^-$-type silicon carbide epitaxial layer 2.

Figure 9:
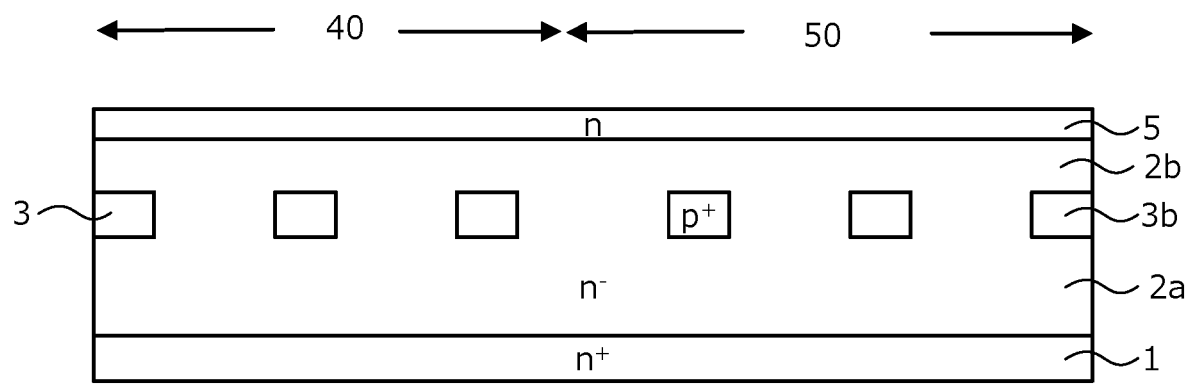
FIG. 9 is a cross-sectional view of a state of the silicon carbide semiconductor device according to the first embodiment during manufacture.

Next, a portion of the ion implantation mask may be removed, an n-type impurity such as nitrogen may be ion implanted in the opening, whereby the n-type high-concentration region 5 may be formed in a portion of a surface region of the n$^-$-type silicon carbide epitaxial layer 2. However, in some instances the n-type high-concentration region 5 is formed in an entire area of the substrate surface and in some instances, the n-type high-concentration region 5 is not formed. The state up to here is depicted in FIG. 9.

Next, on the surface of the n$^-$-type silicon carbide epitaxial layer 2, the p-type silicon carbide epitaxial layer 6 is formed by epitaxial growth. After the p-type silicon carbide epitaxial layer 6 is formed by epitaxial growth, in the p-type silicon carbide epitaxial layer 6, a p-type impurity such as aluminum may be further ion implanted in a channel region of the p-type silicon carbide epitaxial layer 6.

Figure 10:
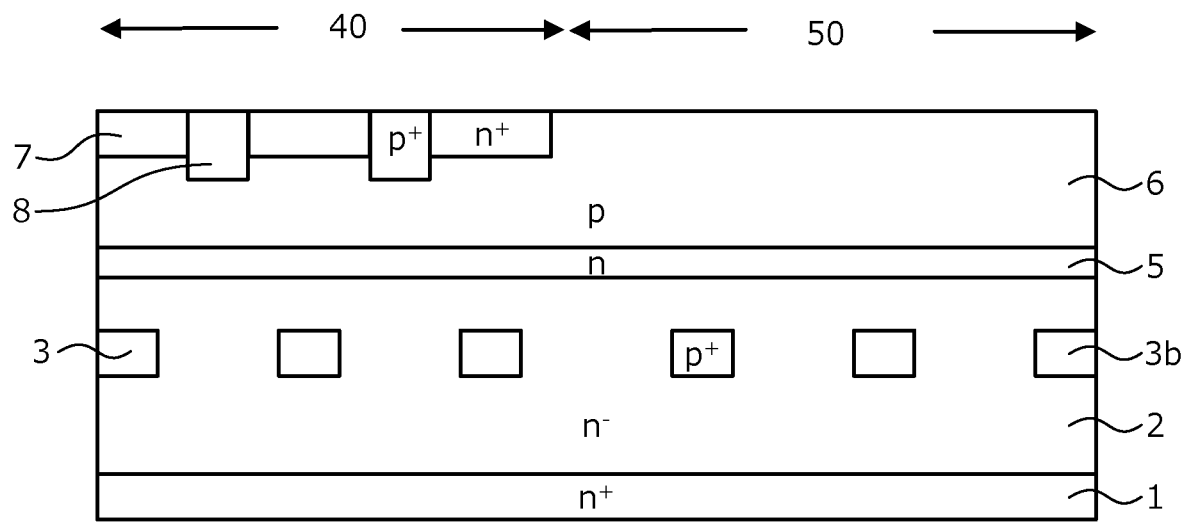
FIG. 10 is a cross-sectional view of a state of the silicon carbide semiconductor device according to the first embodiment during manufacture.

Next, on the surface of the p-type silicon carbide epitaxial layer 6, an ion implantation mask having predetermined openings is formed by photolithography, for example, using an oxide film. In the openings, an n-type impurity such as nitrogen (N), phosphorus (P), etc. is ion implanted, thereby forming the n$^+$-type source regions 7 in portions of the p-type silicon carbide epitaxial layer 6 at the surface thereof. The n$^+$-type source regions 7 are formed only in the active region 40. Next, the ion implantation mask used in forming the n$^+$-type source regions 7 is removed. A new ion implantation mask is formed and a p-type impurity such as aluminum (Al), boron (B) is ion implanted, whereby the p$^+$-type contact regions 8 are formed between adjacent n$^+$-type source regions 7 of the n$^+$-type source regions 7. The p$^+$-type contact regions 8 are formed only in the active region 40. The state up to here is depicted in FIG. 10.

Next, on the surface of the p-type silicon carbide epitaxial layer 6, a trench formation mask having predetermined openings is formed by photolithography, for example, using an oxide film. Next, the trenches 16a, 16b that penetrate through the p-type silicon carbide epitaxial layer 6 and reach the n$^-$-type silicon carbide epitaxial layer 2 are formed by dry etching. The bottoms of the trenches 16a, 16b respectively reach the first p$^+$-type base regions 3, 3b formed in the n$^-$-type silicon carbide epitaxial layer 2. The trenches 16a are formed in the active region 40 and the trenches 16b are formed in the gate pad region 50. Next, the trench formation mask is removed.

Next, oblique ion implantation of a p-type impurity such as aluminum is performed from openings of the trenches 16a, thereby forming the second p$^+$-type base regions 4 in a portion of a sidewall of each of the trenches 16a. The second p$^+$-type base regions 4b may be formed concurrently in the sidewalls of the trenches 16b.

Figure 11:
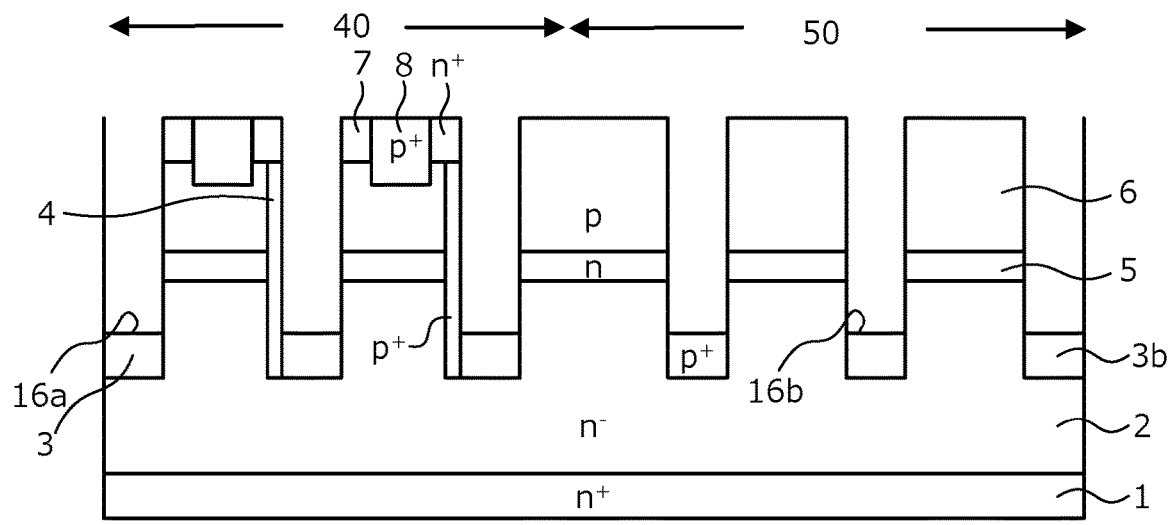
FIG. 11 is a cross-sectional view of a state of the silicon carbide semiconductor device according to the first embodiment during manufacture.

Next, a heat treatment (annealing) under an inert gas atmosphere of a temperature of about 1700 degrees C. is performed, implementing an activation process of the first p$^+$-type base regions 3, 3b, the second p$^+$-type base regions 4, the p$^+$-type contact regions 8, and the n$^+$-type source regions 7. As described above, the ion implanted regions may be activated collectively by a single heat treatment session or may be activated by performing the heat treatment each time ion implantation is performed. The state up to here is depicted in FIG. 11.

Next, the gate insulating films 9, 9b are formed along a surface of each of the n$^+$-type source regions 7, the bottoms and the sidewalls of the trenches 16a, 16b. The gate insulating films 9, 9b may be formed by thermal oxidation of a temperature of about 1000 degrees C. under an oxygen atmosphere. Further, the gate insulating films 9, 9b may be formed by a deposition method by a chemical reaction such as that for a high temperature oxide (HTO).

Figure 12:
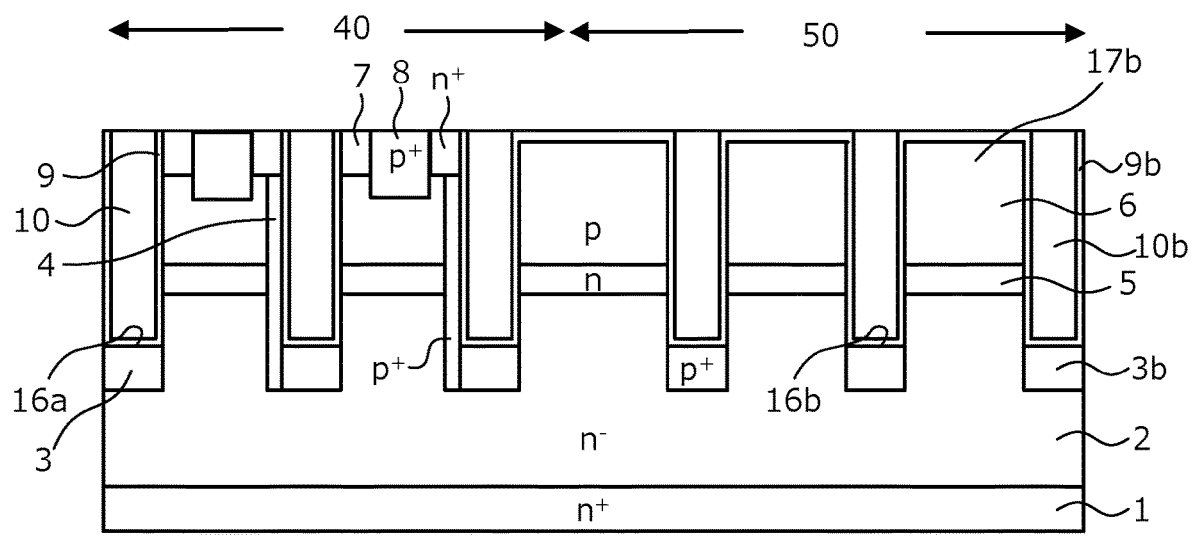
FIG. 12 is a cross-sectional view of a state of the silicon carbide semiconductor device according to the first embodiment during manufacture.

Next, a polycrystalline silicon film doped with, for example, phosphorus atoms is provided on the gate insulating films 9, 9b. The polycrystalline silicon film may be formed so as to be embedded in the trenches 16a, 16b. The polycrystalline silicon film is patterned by photolithography and left in the trenches 16a, 16b, whereby the gate electrodes 10, 10b are formed. The state up to here is depicted in FIG. 12.

Next, for example, phosphate glass is deposited to have a thickness of about 1 µm and cover the gate insulating films 9, 9b and the gate electrodes 10, 10b, thereby forming the interlayer insulating film 11. The interlayer insulating film 11 and the gate insulating film 9 are patterned by photolithography, thereby forming contact holes that expose the n$^+$-type source regions 7 and the p-type silicon carbide epitaxial layer 6. Thereafter, a heat treatment (reflow) is performed, planarizing the interlayer insulating film 11. Further, after the contact holes are formed in the interlayer insulating film 11, barrier metal may be formed by titanium (Ti) or titanium nitride (TiN) or a stacked layer of titanium and titanium nitride. In this instance, the contact holes exposing the n$^+$-type source regions 7 are also formed in the barrier metal. In an instance in which the gate electrode wiring 15 is formed, a process of forming a polycrystalline silicon film doped with, for example, phosphorus atoms and forming, for example, phosphate glass having a thickness of about 1 µm as the interlayer insulating film 11B is added thereafter.

Next, on the interlayer insulating film 11 and in the contact holes provided in the interlayer insulating film 11, a conductive film constituting the source electrode 12 is formed. The conductive film is, for example, a nickel (Ni) film. Thereafter, for example, a heat treatment is performed at a temperature of about 970 degrees C. and the nickel film in the contact holes is converted into a silicide as the source electrode 12. Thereafter, the unreacted nickel film is selectively removed and, for example, the source electrode 12 is left only in a contact hole.

Next, the source electrode pad (not depicted) is formed so as to be embedded in the contact hole. A portion of a metal layer deposited to form the source electrode pad may be used as the gate electrode pad 14. On the back surface of the n$^+$-type silicon carbide substrate 1, a metal film such as a nickel (Ni) film, a titanium (Ti) film, etc. is formed in a contact portion of the back electrode 13 using sputtering deposition. The metal film may have stacked layers of a combination of a Ni film and a Ti film. Thereafter, annealing such as a rapid heat treatment (rapid thermal annealing (RTA)) is implemented so that the metal film is converted into a silicide and an ohmic contact is formed. Thereafter, for example, a thick film such as a layered film in which a Ti film, an Ni film, and a gold (Au) film are sequentially stacked is formed by electron beam (EB) deposition, thereby forming the back electrode 13.

In the epitaxial growth and the ion implantations described above, as an n-type impurity (n-type dopant), for example, nitrogen (N) or phosphorus (P), arsenic (As), antimony (Sb), etc. that are an n-type with respect to silicon carbide may be used. As a p-type impurity (p-type dopant), for example, boron (B) or aluminum (Al), gallium (Ga), indium (In), thallium (TI), etc. that are a p-type with respect to silicon carbide may be used. In this manner, the trench-type MOSFET 70 depicted in FIG. 1A is completed. Here, for the gate pad region 50, while an instance of the second structure is depicted, other structures may be similarly formed.

As described above, according to the first embodiment, in the gate pad region as well, the trenches and the first p$^+$-type base regions underlying the bottoms of the trenches are provided. As a result, the pn interfaces between the n$^-$-type silicon carbide epitaxial layer and the first p$^+$-type base regions are the same depth from the surface of the silicon carbide semiconductor base in the active region and in the gate pad region. Therefore, concentration of avalanche current in the gate pad region is eliminated and the withstand voltage of the gate pad region may be sustained and the reliability of the gate insulating films may be enhanced.

Figure 13:
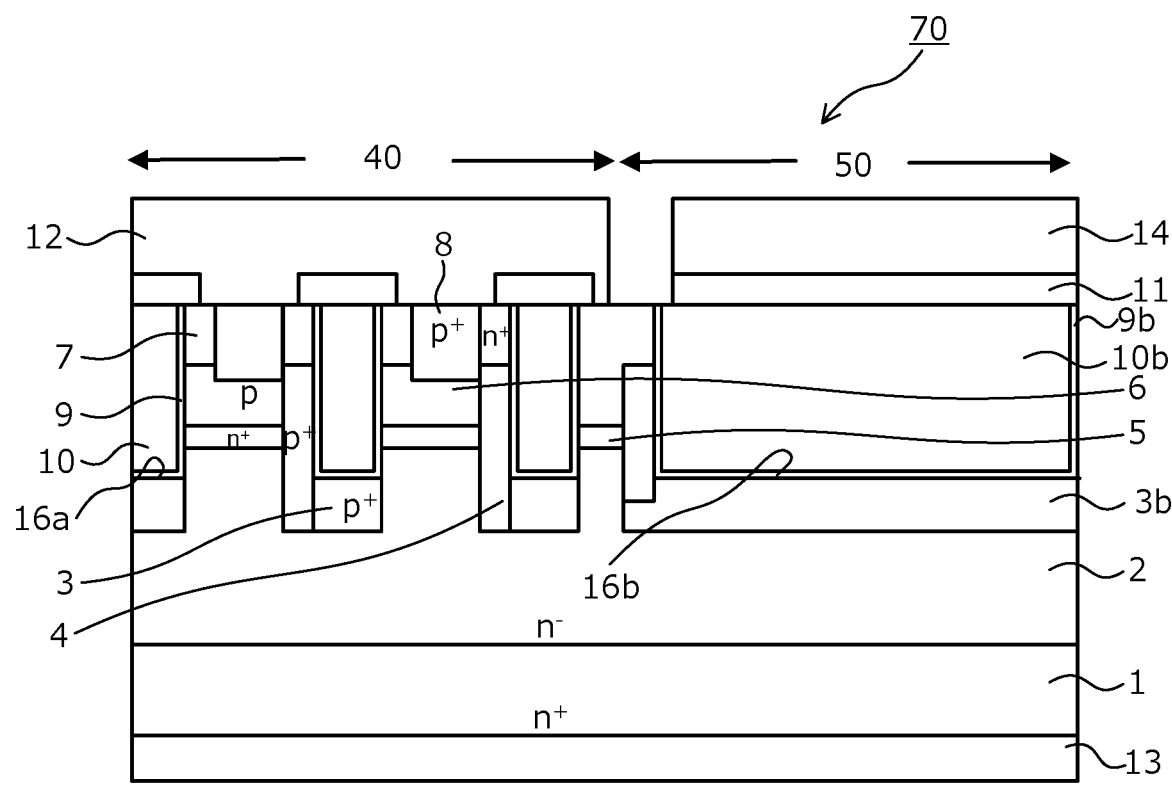
FIG. 13 is a cross-sectional view of a structure of the active region and the gate pad region of a silicon carbide semiconductor device according to a second embodiment.
Figure 14:
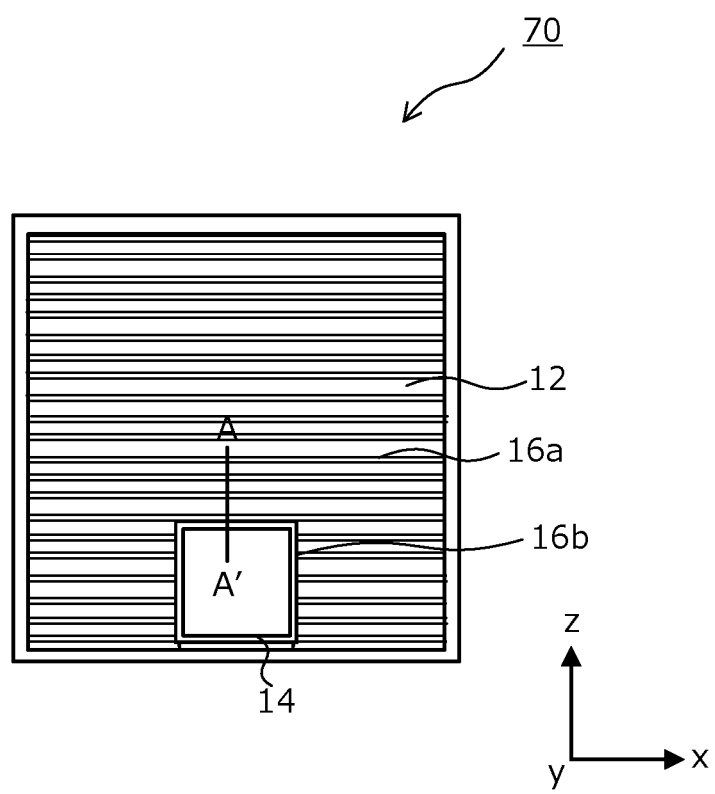
FIG. 14 is a top view of the structure of the silicon carbide semiconductor device according to the second embodiment.
Figure 15:
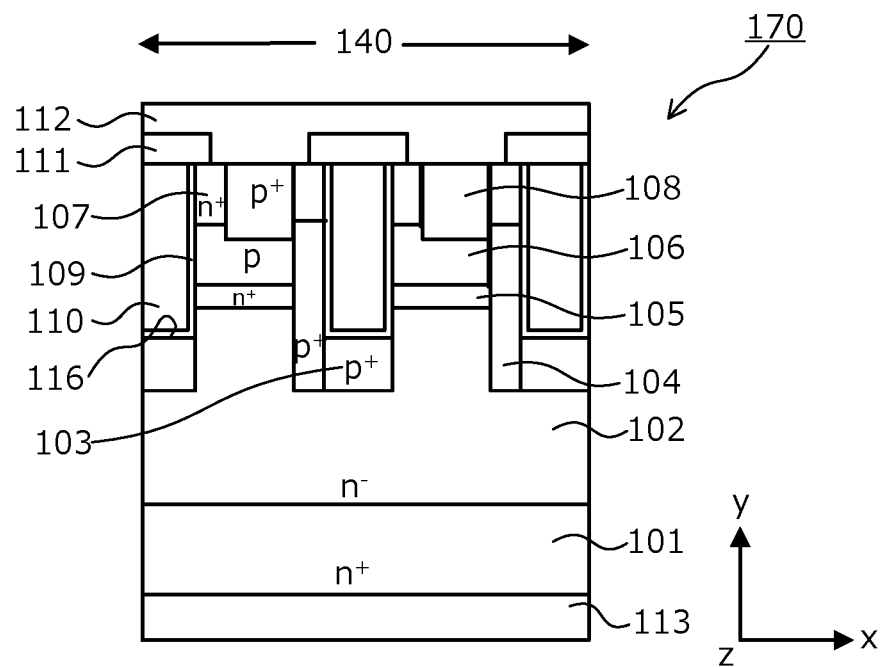
FIG. 15 is a cross-sectional view of the structure of an active region of a conventional silicon carbide semiconductor device.

FIG. 13 is a cross-sectional view of a structure of the active region and the gate pad region of the silicon carbide semiconductor device according to the second embodiment. FIG. 14 is a top view of the structure of the silicon carbide semiconductor device according to the second embodiment. FIG. 13 is a cross-sectional view along cutting line A-A' in FIG. 14. The silicon carbide semiconductor device according to the second embodiment differs from the silicon carbide semiconductor device according to the first embodiment in that in the gate pad region 50, only one of the trenches 16b is provided and the width (second width) of the trench 16b in the gate pad region 50 is wider than the width (first width) of the trenches 16a in the active region 40.

In the gate pad region 50, the size of the trench 16b is slightly larger than that of the gate electrode pad 14. In other words, the width of the trench 16b is slightly wider than the width of the gate electrode pad 14 and a length of the trench 16b (length in the z-direction) is slightly longer than a length of the gate electrode pad 14. Further, beneath a side of the gate electrode pad 14 facing the back electrode 13, a polycrystalline silicon film extends in an entire area in the trench 16b as the gate electrode 10b, the interlayer insulating film 11 being interposed between the gate electrode pad 14 and the polycrystalline silicon film. The gate electrode 10b may be slightly smaller than the gate electrode pad 14. For example, when edges of the gate electrode 10b are about 10% smaller than edges of the gate electrode pad 14, the polycrystalline silicon film may be considered to virtually extend in an entire area of beneath the gate electrode pad 14. For the gate electrode 10b, other than polycrystalline silicon, a high-melting point metal such as titanium or tungsten, a silicide thereof, a nitride, and a stacked film of these may be used. Here, a contact hole may be provided in the interlayer insulating film 11 and the gate electrode 10b in the trench 16b and the gate electrode pad 14 may be connected electrically. As a result, contact with the first p$^+$-type base region 3b at a lower portion of the trench 16b is facilitated and as compared to the first embodiment, the protective function of the gate insulating film 9b in the gate pad region 50 increases. In the gate pad region 50, like the third structure of the first embodiment, one of the second p$^+$-type base regions 4b may be selectively provided at one of the sidewalls of the trench 16b. Further, like the fifth structure of the first embodiment, the second p$^+$-type base regions 4b may be selectively provided at both sidewalls of the trench 16b.

Further, a sidewall of an outermost peripheral trench 16a of the trenches 16a in the active region 40, the sidewall thereof facing the gate pad region 50, is free of the n$^+$-type source regions 7 and in contact with the p-type silicon carbide epitaxial layer 6. As a result, holes (positive holes) from the first p$^+$-type base region 3b of the gate pad region 50 may be easily pulled out.

The first p$^+$-type base region 3b is provided in an entire area of the bottom of the trench 16b. Due to the wide width of the trench 16b, the first p$^+$-type base region 3b formed beneath the trench 16b has an impurity concentration higher than the impurity concentration of the first p$^+$-type base regions 3 formed beneath the trenches 16a of the active region 40. This is because even when the trench 16b is formed by the same manufacturing method as that of the trenches 16a, the impurities implanted by ion implantation are absorbed by a sidewall of the mask at a low rate. Furthermore, due to the width of the trench 16b being wide, the trench 16b is formed deeper than are the trenches 16a. In this manner, by providing the first p$^+$-type base region 3b having a high impurity concentration and a deep depth, concentration of holes in the trench 16b is facilitated, thereby facilitating control of the holes. For example, in FIG. 13, while the trench 16b having a wide width is provided singularly, two or more of the trenches 16b having a wide width may be provided. In this instance, in a region between the trenches 16b, a structure that pulls out holes may be provided, thereby enabling control of the holes to be facilitated.

In the method of manufacturing the silicon carbide semiconductor device according to the first embodiment, when the trench 16b is formed in the gate pad region 50, the silicon carbide semiconductor device according to the second embodiment may be manufacture by forming one or more of the trenches 16b having a width wider than the width of the trenches 16a of the active region 40. Further, instead of forming the first p$^+$-type base region 3b by the ion implantation in FIG. 9, after formation of the trenches 16a, 16b, the ion implantation is performed at the bottoms of the trenches 16a, 16b, whereby the first p$^+$-type base regions 3b having a high impurity concentration and a deeper depth may be formed.

As described above, according to the second embodiment, effects similar to those of the first embodiment may be obtained. Further, in the second embodiment, in the gate pad region, the trench width is wider than the trench width in the active region. As a result, contact with the first p$^+$-type base region at a lower portion of the trench is facilitated and as compared to the first embodiment, the function of protecting the gate insulating film in the gate pad region increases.

In the foregoing, the present invention may be variously modified within a range not departing from the spirit of the invention, for example, in the embodiments described above, dimensions, impurity concentrations, etc. of regions are variously set according to necessary specifications. Further, in the embodiments described above, while description is given taking, as an example, an instance in which silicon carbide is used as a wide bandgap semiconductor, other than silicon carbide, for example, a wide bandgap semiconductor such as gallium nitride (GaN) may be applied. Further, silicon (Si), a semiconductor other than a wide bandgap semiconductor such as germanium (Ge) is applicable. In the embodiments, while the first conductivity type is assumed to be an n-type and the second conductivity type is assumed to be a p-type, the present invention is similarly implemented when the first conductivity type is a p-type and the second conductivity type is an n-type.

According to the embodiments of the invention described above, in the gate pad region as well, the trenches and the first p$^+$-type base regions (second semiconductor regions of the second conductivity type) underlying the trenches are provided. As a result, the pn interfaces between the n$^-$-type silicon carbide epitaxial layer (first semiconductor layer of the first conductivity type) and the first p$^+$-type base regions are at the same depth from the surface of the silicon carbide semiconductor base in the active region and in the gate pad region. Therefore, concentration of avalanche current in the gate pad region is eliminated, the withstand voltage of the gate pad region may be sustained, and the reliability of the gate insulating films may be enhanced.

The semiconductor device according to the present invention achieves an effect in that concentration of avalanche current in gate pad region is eliminated and the reliability of the gate pad region may be enhanced.

As described above, the silicon carbide semiconductor device and the method of manufacturing the silicon carbide semiconductor device according to the present invention are useful power semiconductor devices used in power converting equipment such as inverters, power source devices such as those in various types of industrial machines, and igniters of automobiles.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
   a semiconductor substrate of a first conductivity type, having an active portion and a gate pad portion, the semiconductor substrate having a first surface and a second surface opposite to each other;
   a first semiconductor layer of the first conductivity type, provided on the first surface of the semiconductor substrate, and having an impurity concentration lower than an impurity concentration of the semiconductor substrate, the first semiconductor layer having a first surface and a second surface opposite to each other, the second surface of the first semiconductor layer facing the semiconductor substrate;
   a second semiconductor layer of a second conductivity type, provided on the first surface of the first semiconductor layer, the second semiconductor layer having a first surface and a second surface opposite to each other, the second surface of the second semiconductor layer facing the semiconductor substrate;
   in the active portion:
      a plurality of first semiconductor regions of the first conductivity type, selectively provided in the second semiconductor layer at the first surface thereof;
      a plurality of first trenches penetrating through the first semiconductor regions and the second semiconductor layer and reaching the first semiconductor layer;
      a plurality of first gate electrodes provided in the first trenches via gate insulating films, respectively;
      an interlayer insulating film provided on the first gate electrodes;
      a first electrode provided on a surface of the second semiconductor layer and a surface of each of the first semiconductor regions;
      a second electrode provided on the second surface of the semiconductor substrate; and
      a plurality of second semiconductor regions of the second conductivity type, each provided in the first semiconductor layer so as to be in contact with a respective one of bottoms of the first trenches;
   in the gate pad portion:
      one or more second trenches each penetrating the second semiconductor layer and reaching the first semiconductor layer;
      an insulating film provided in all of the one or more second trenches;
      one or more second gate electrodes provided on the insulating film in the one or more second trenches, respectively;
      one or more fourth semiconductor regions of the second conductivity type, each provided in the first semiconductor layer so as to be in contact with a respective one of bottoms of the one or more second trenches;
      a gate electrode pad connected electrically to the one or more second gate electrodes; and
      a polycrystalline silicon film provided between the gate electrode pad and the semiconductor substrate.

2. The semiconductor device according to claim 1, wherein
   the one or more second trenches include at least two second trenches adjacent to one another that form a mesa region,
   the insulating film is further provided on a surface of the semiconductor substrate in the mesa region, and
   the polycrystalline silicon film is a gate electrode wiring provided on a portion of the insulating film on the surface of the semiconductor substrate in the mesa region.

3. The semiconductor device according to claim 1, further comprising
   a plurality of third semiconductor regions of the second conductivity type, each of which is provided in the first semiconductor layer so as to be in contact with a respective one of at least one of sidewalls of each of the first trenches, the first trenches extending in a first direction and the sidewalls of each of the first trenches facing in a second direction orthogonal to the first direction, the third semiconductor regions electrically connecting the second semiconductor regions to the second semiconductor layer.

4. The semiconductor device according to claim 3, wherein
   each of the third semiconductor regions is provided separated from one another by an interval, in the first semiconductor layer.

5. The semiconductor device according to claim 1, further comprising
   one or more fifth semiconductor regions of the second conductivity type, each of which is provided in the first semiconductor layer so as to be in contact with a corresponding one of at least one of sidewalls of the one or more second trenches, and electrically connects the second semiconductor layer and a corresponding one of the one or more fourth semiconductor regions.

6. The semiconductor device according to claim 5, wherein
   the one or more fifth semiconductor regions include a plurality of fifth semiconductor regions, each of which is provided in the first semiconductor layer so as to be in contact with a respective one of the sidewalls of the one or more second trenches.

7. The semiconductor device according to claim 5, wherein
an impurity concentration of the one or more fourth semiconductor regions is higher than an impurity concentration of the second semiconductor regions.

8. The semiconductor device according to claim 1, further comprising a wire connected to the gate pad portion, wherein
the one or more second trenches extend in a direction parallel to the wire connected to the gate pad portion.

9. The semiconductor device according to claim 1, wherein
each of the first trenches extends in a first direction and has a first width in a second direction orthogonal to the first direction,
each of the second trenches extending in a third direction and having a second width in a fourth direction orthogonal to the third direction,
the second width of the one or more second trenches is wider than the first width of the first trenches.

10. The semiconductor device according to claim 1, wherein
the polycrystalline silicon film is the one or more second gate electrodes, and the one or more second gate electrodes are provided in an entire area below the gate electrode pad in a plan view of the semiconductor device and between the gate electrode pad and the semiconductor substrate.

11. The semiconductor device according to claim 1, wherein
a depth of the one or more second trenches is deeper than a depth of the first trenches, as measured from the first surface of the second semiconductor layer.

12. The semiconductor device according to claim 1, wherein
of the first trenches, an outermost peripheral first trench of the active portion has a sidewall facing the gate pad portion in a second direction orthogonal to a first direction that is parallel to directions in which the first trenches extend, the sidewall facing the gate pad portion being free of the first semiconductor regions.

* * * * *